(12) United States Patent
Fujiki et al.

(10) Patent No.: US 7,885,106 B2
(45) Date of Patent: Feb. 8, 2011

(54) NONVOLATILE SEMICONDUCTOR MEMORY DEVICE AND METHOD FOR DRIVING SAME

(75) Inventors: Jun Fujiki, Kanagawa-ken (JP); Koichi Muraoka, Kanagawa-ken (JP); Naoki Yasuda, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 154 days.

(21) Appl. No.: 12/411,746

(22) Filed: Mar. 26, 2009

(65) Prior Publication Data

US 2010/0080062 A1    Apr. 1, 2010

(30) Foreign Application Priority Data

Sep. 29, 2008  (JP) ............................. 2008-251871

(51) Int. Cl.
G11C 16/04  (2006.01)
G11C 29/792  (2006.01)
G11C 5/14  (2006.01)
G11C 11/34  (2006.01)

(52) U.S. Cl. ........................... 365/185.01; 365/185.18; 365/189.09; 365/184; 257/324; 257/E29.309

(58) Field of Classification Search ....................... None
See application file for complete search history.

(56) References Cited

U.S. PATENT DOCUMENTS

| 6,459,622 | B1 | 10/2002 | Ogura et al. |
| 7,098,505 | B1 * | 8/2006 | Han et al. .................... 257/324 |
| 7,202,521 | B2 | 4/2007 | Kim et al. |
| 2007/0076477 | A1 | 4/2007 | Hwang et al. |

* cited by examiner

*Primary Examiner*—Huan Hoang
*Assistant Examiner*—James G Norman
(74) *Attorney, Agent, or Firm*—Oblon, Spivak, McClelland, Maier & Neustadt, L.L.P.

(57) ABSTRACT

A nonvolatile semiconductor memory device includes: a semiconductor substrate including a first channel, and a source region and a drain region provided on both sides of the first channel; a first insulating film provided on the first channel; a charge retention layer provided on the first insulating film; a second insulating film provided on the charge retention layer; and a semiconductor layer including a second channel provided on the second insulating film, and a source region and a drain region provided on both sides of the second channel.

20 Claims, 12 Drawing Sheets

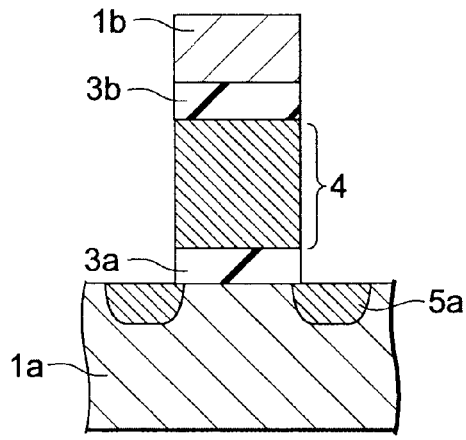
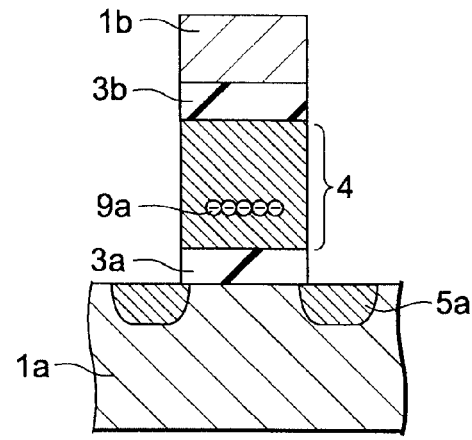
FIG. 6A FIG. 6B
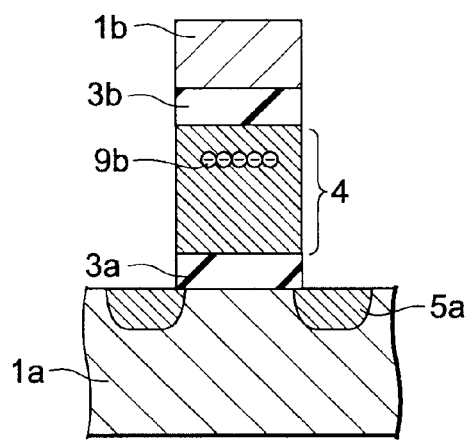
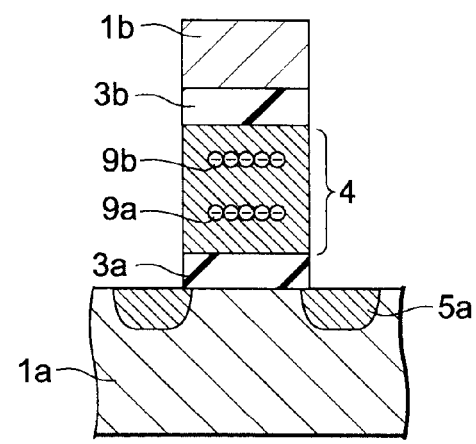
FIG. 6C FIG. 6D

|  | $V_T(sub)_1$ | $V_T(sub)_2$ | $V_T(sub)_3$ | $V_T(sub)_4$ |
|---|---|---|---|---|
| $x_1$ | 0000' | 1000' | 0010' | 1010' |
| $x_2$ | 0100' | 1100' | 0110' | 1110' |
| $x_3$ | 0001' | 1001' | 0011' | 1011' |
| $x_4$ | 0101' | 1101' | 0111' | 1111' |

FIG. 14A

|  | $V_T(sub)_1$ | $V_T(sub)_2$ | $V_T(sub)_3$ | $V_T(sub)_4$ |
|---|---|---|---|---|
| $V_T(poly)_1$ | 0000 | 1000 | 0010 | 1010 |
| $V_T(poly)_2$ | 0100 | 1100 | 0110 | 1110 |
| $V_T(poly)_3$ | 0001 | 1001 | 0011 | 1011 |
| $V_T(poly)_4$ | 0101 | 1101 | 0111 | 1111 |

FIG. 14B

NONVOLATILE SEMICONDUCTOR MEMORY DEVICE AND METHOD FOR DRIVING SAME

CROSS-REFERENCE TO RELATED APPLICATIONS

This application is based upon and claims the benefit of priority from the prior Japanese Patent Application No. 2008-251871, filed on Sep. 29, 2008; the entire contents of which are incorporated herein by reference.

BACKGROUND OF THE INVENTION

1. Field of the Invention

This invention relates to a nonvolatile semiconductor memory device based on transistor memory cells having a charge retention layer, and a method for driving the same.

2. Background Art

In a NAND flash memory having a charge storage layer or a floating electrode as a charge retention layer, with the recent trend of its downscaling, there has been a limit to the number of charges retained in a single memory cell. Decrease in the number of charges retained translates into narrowing of the operable threshold range. This tends to make it difficult to introduce the so-called multilevel techniques.

With a view to avoiding these problems specific to high-density flash memories, U.S. Pat. No. 6,459,622 B1 mentions a nonvolatile memory that uses charge-trapping positions in a memory cell to store additional information. For example, in a NOR flash memory having a charge storage layer, it discloses a technique for storing two bits of information per memory cell by controlling charge-trapping positions in the channel direction. In principle, charge-trapping positions in the direction parallel to the channel and charge-trapping positions in the direction perpendicular to the channel have the possibility of storing additional information. However, the NAND flash memory has no controllability over charge-trapping positions in the channel direction because electrical contact with the source/drain of a memory cell transistor is omitted therein. Furthermore, in a conventional flash memory, there is no means for detecting charge-trapping positions in the direction perpendicular to the channel.

In this context, United States Patent Application Publication No. 2007/0076477 A1 discloses a NOR-type MONOS memory in which the charge storage layer is uniform and the source/drain side is separately programmed.

Furthermore, U.S. Pat. No. 7,202,521 B2 discloses a SONOS memory device, which includes an upper stacked structure forming an upper SONOS memory element in conjunction with a semiconductor layer, and a lower stacked structure provided below the semiconductor layer and forming a lower SONOS memory element in conjunction with the semiconductor layer.

SUMMARY OF THE INVENTION

According to an aspect of the invention, there is provided a nonvolatile semiconductor memory device including: a semiconductor substrate including a first channel, and a source region and a drain region provided on both sides of the first channel; a first insulating film provided on the first channel; a charge retention layer provided on the first insulating film; a second insulating film provided on the charge retention layer; and a semiconductor layer including a second channel provided on the second insulating film, and a source region and a drain region provided on both sides of the second channel.

According to another aspect of the invention, there is provided a method for driving a nonvolatile semiconductor memory device, the nonvolatile semiconductor memory device including a semiconductor substrate including a first channel, and a source region and a drain region provided on both sides of the first channel; a first insulating film provided on the first channel; a charge retention layer provided on the first insulating film; a second insulating film provided on the charge retention layer; and a semiconductor layer including a second channel provided on the second insulating film, and a source region and a drain region provided on both sides of the second channel, the method including: reading a threshold of a transistor including the first channel; reading a threshold of a transistor including the second channel; and outputting information corresponding to a storage state of charge retained in the charge retention layer.

BRIEF DESCRIPTION OF THE DRAWINGS

FIGS. 6A to 6D are schematic cross-sectional views for describing the function of the nonvolatile semiconductor memory device according to the first embodiment of the invention;

FIGS. 14A and 14B are schematic diagrams for describing the method for driving a nonvolatile semiconductor memory device according to the fourth embodiment of the invention.

DETAILED DESCRIPTION OF THE INVENTION

Figure 1:
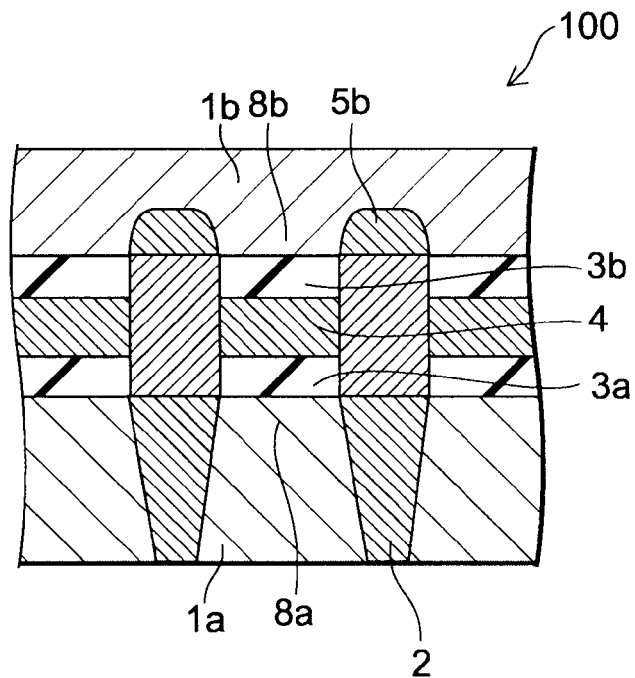
FIG. 1 is a schematic cross-sectional view illustrating the configuration of a nonvolatile semiconductor memory device according to a first embodiment of the invention.

Embodiments of the invention will now be described in detail with reference to the drawings.

The drawings are schematic or conceptual. The relationship between the thickness and the width of each portion, and the size ratio between the portions are not necessarily identical to those in reality. Furthermore, the same portion may be shown with different dimensions or ratios in different figures.

In the present specification and drawings, the same elements as those described previously with reference to earlier figures are labeled with like reference numerals, and the detailed description thereof is omitted as appropriate.

First Embodiment

The nonvolatile semiconductor memory device according to a first embodiment of the invention is applicable to a transistor memory cell having a charge storage layer or a floating electrode as a charge retention layer. The charge storage layer or the floating electrode is not necessarily needed to be a single layer, but may be illustratively two or three layers. Furthermore, the charge storage layer or the floating electrode may be replaced by a floating dot layer (nanocrystal layer).

In the following, the nonvolatile semiconductor memory device according to this embodiment is described with an N-channel charge storage-type memory cell taken as an example. It is noted that the nonvolatile semiconductor memory device according to this embodiment is not limited to the N-channel type, but is also applicable to the P-channel type. In that case, the following description is analogously applicable by reversing the polarity of impurities in the source/drain or the semiconductor substrate and exchanging voltages applied to the semiconductor substrate and the gate electrode.

FIG. 1 is a schematic cross-sectional view illustrating the configuration of a nonvolatile semiconductor memory device according to the first embodiment of the invention.

Figure 2:
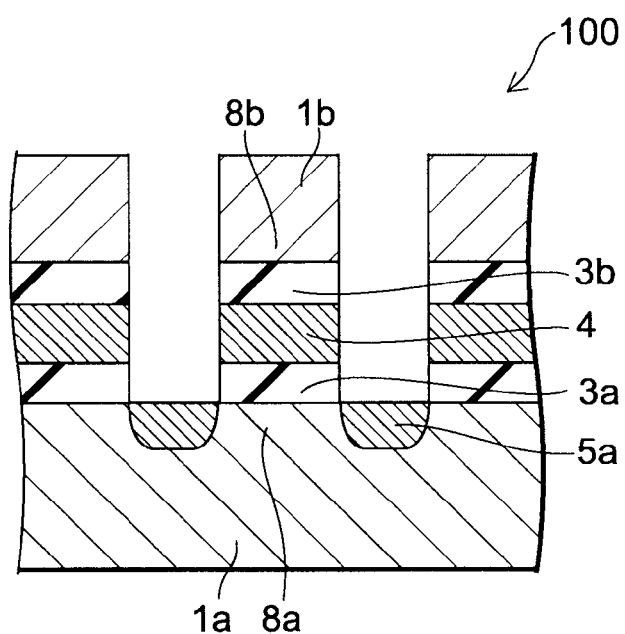
FIG. 2 is another schematic cross-sectional view illustrating the configuration of the nonvolatile semiconductor memory device according to the first embodiment of the invention.

FIG. 2 is another schematic cross-sectional view illustrating the configuration of the nonvolatile semiconductor memory device according to the first embodiment of the invention.

Figure 3:
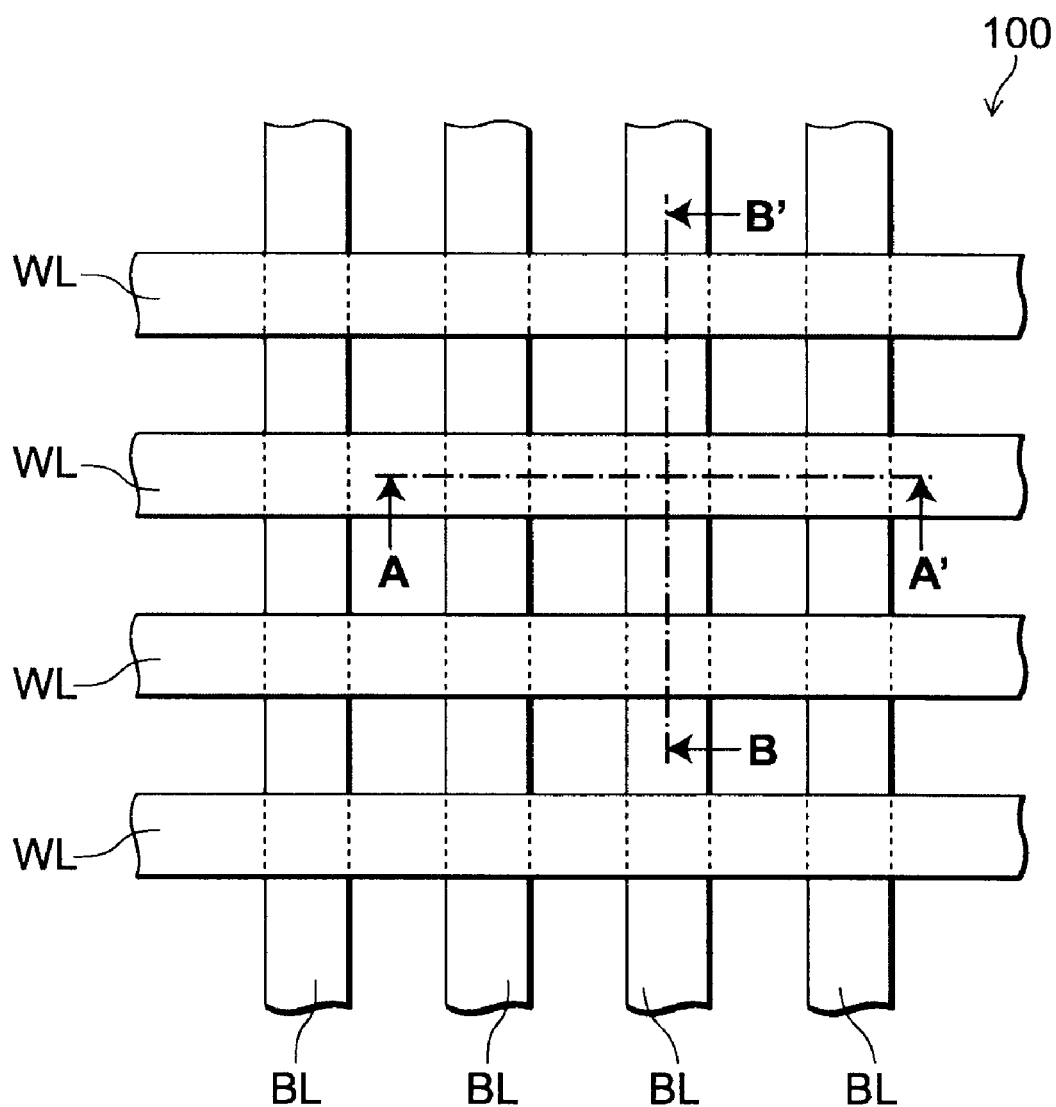
FIG. 3 is a schematic plan view illustrating the configuration of the nonvolatile semiconductor memory device according to the first embodiment of the invention.

FIG. 3 is a schematic plan view illustrating the configuration of the nonvolatile semiconductor memory device according to the first embodiment of the invention.

More specifically, FIG. 3 is a schematic plan view showing part of a NAND memory cell array, which is the nonvolatile semiconductor memory device 100 according to the first embodiment of the invention, FIG. 1 is a cross-sectional view taken along line A-A' in FIG. 3, and FIG. 2 is a cross-sectional view taken along line B-B' in FIG. 3. That is, FIG. 1 is a cross-sectional view taken along a cross section parallel to a word line WL, and FIG. 2 is a cross-sectional view taken along a plane parallel to a bit line BL.

As shown in FIGS. 1 and 2, the nonvolatile semiconductor memory device 100 according to the first embodiment of the invention is a charge storage-type memory cell and, on a semiconductor substrate 1a, includes a charge storage layer 4, a first insulating film 3a provided between the charge storage layer 4 and the semiconductor substrate 1a, and a second insulating film 3b provided on the charge storage layer 4. The first insulating film 3a and the second insulating film 3b sandwich the charge storage layer 4. The first insulating film 3a, the charge storage layer 4, and the second insulating film 3b are included in the memory cell.

Furthermore, a semiconductor layer 1b is provided on the second insulating film 3b.

Source/drain diffusion layers 5a are provided on the memory cell side of the semiconductor substrate 1a, and source/drain diffusion layers 5b are provided on the memory cell side of the semiconductor layer 1b.

Here, one of the source/drain diffusion layers 5a, 5b may spontaneously form a channel by capacitive coupling with the semiconductor substrate 1a and the semiconductor layer 1b (see, e.g., Chang-Hyun Lee, et al., VLSI Tech. Dig., pp. 118-119, 2008; and Hang-Ting Lue, et al., VLSI Tech. Dig., pp. 140-141, 2008). Also in this case, the nonvolatile semiconductor memory device 100 is referred to as including the source/drain diffusion layers 5a, 5b.

Thus, the nonvolatile semiconductor memory device 100 according to this embodiment comprises a semiconductor substrate 1a including a first channel 8a, and a source region and a drain region (source/drain diffusion layers 5a) provided on both sides of the first channel 8a; a first insulating film 3a provided on the first channel 8a; a charge storage layer (charge retention layer) 4 provided on the first insulating film 3a; a second insulating film 3b provided on the charge storage layer 4; and a semiconductor layer 1b provided on the second insulating film 3b and including a second channel 8b provided on the second insulating film 3b side, and a source region and a drain region (source/drain diffusion layers 5b) provided on both sides of the second channel 8b.

The semiconductor substrate 1a illustratively includes a P-type well, a P-type semiconductor layer (e.g., SOI, that is, silicon-on-insulator layer), and a P-type polysilicon layer. To select a particular transistor in the semiconductor layer 1b, the semiconductor substrate 1a is preferably an SOI layer. In this case, a device isolation film 2 is formed between adjacent bit lines.

The semiconductor layer 1b illustratively includes a P-type polysilicon layer and an N-type polysilicon layer. To avoid depletion of the semiconductor layer 1b, the semiconductor layer 1b is preferably a P-type polysilicon layer.

The first insulating film 3a, the second insulating film 3b, and the charge storage layer 4 can be based on various materials such as silicon oxide ($SiO_2$), silicon oxynitride (SiON), aluminum oxide ($Al_2O_3$), aluminum oxynitride (AlON), hafnia ($HfO_2$), hafnium aluminate ($HfAlO_3$), nitrided hafnia (HfON), nitrided hafnium aluminate (HfAlON), hafnium silicate (HfSiO), nitrided hafnium silicate (HfSiON), lanthanum oxide ($La_2O_3$), and lanthanum aluminate ($LaAlO_3$). Furthermore, a stacked film thereof may be used.

The charge storage layer 4 may be replaced by a floating electrode or a floating dot layer (e.g., nanocrystal layer). The floating dot layer herein refers to, for example, a layer having a structure in which semiconductor or metal particles (floating dots) are dispersed in an insulating matrix. The floating electrode or the floating dot can be based on semiconductor materials such as silicon (Si), germanium (Ge), GaAs, and InP, and metal materials such as Ti, Ta, Au, Al, and Mo. The floating dot herein refers to a fine particle having a size of 0.5 to 4 nm. The size of the floating dot is preferably 0.5 to 4 nm because a single memory cell needs to contain a sufficient number of floating dots. The floating electrode or the floating dot layer is also not necessarily needed to be a single layer, but may illustratively include two or three, or more layers.

Figure 4:
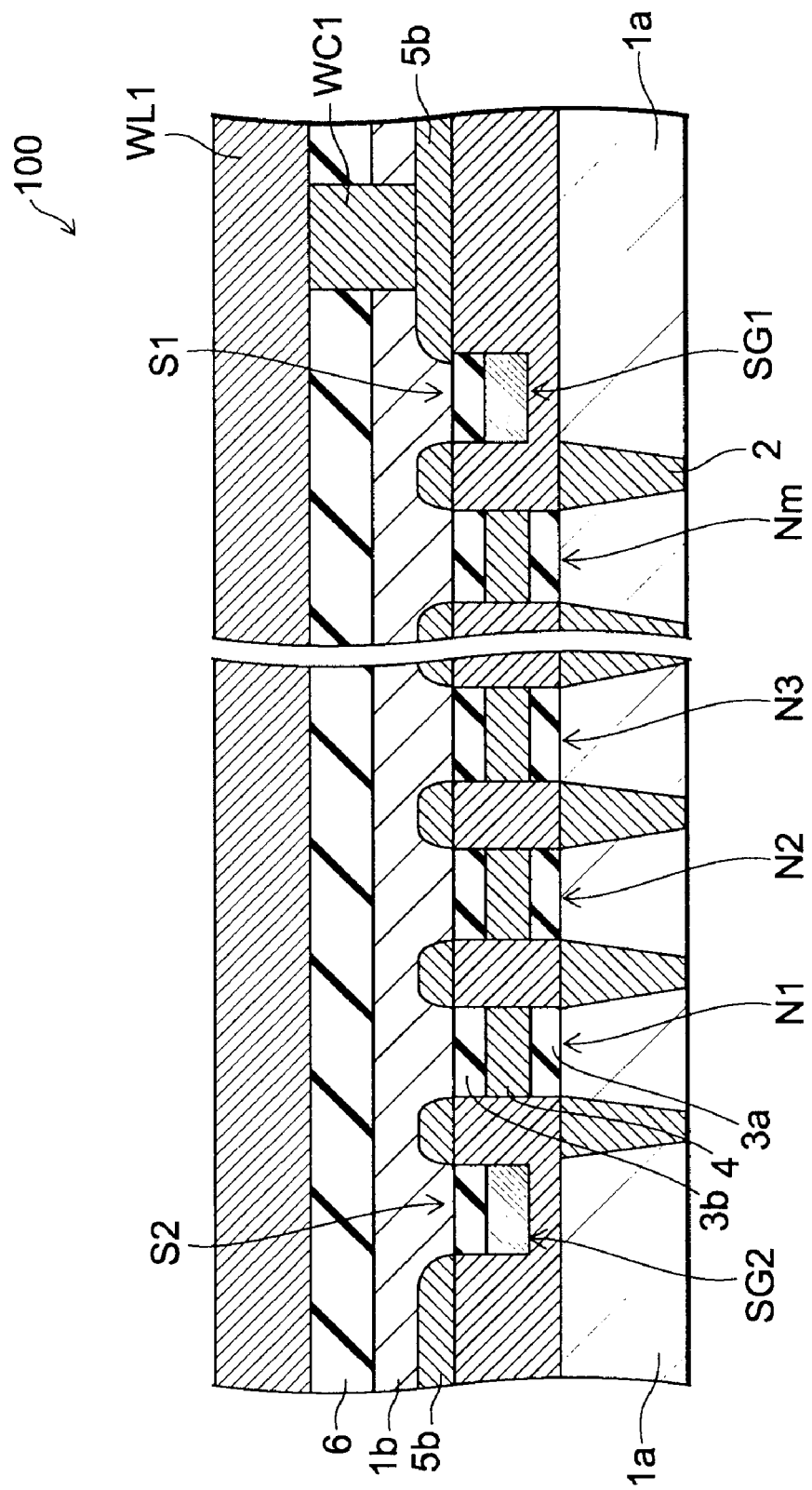
FIG. 4 is a schematic cross-sectional view in the row direction of a NAND string of the nonvolatile semiconductor memory device according to the first embodiment of the invention.

FIG. 4 is a schematic cross-sectional view in the row direction of a NAND string of the nonvolatile semiconductor memory device according to the first embodiment of the invention.

Figure 5:
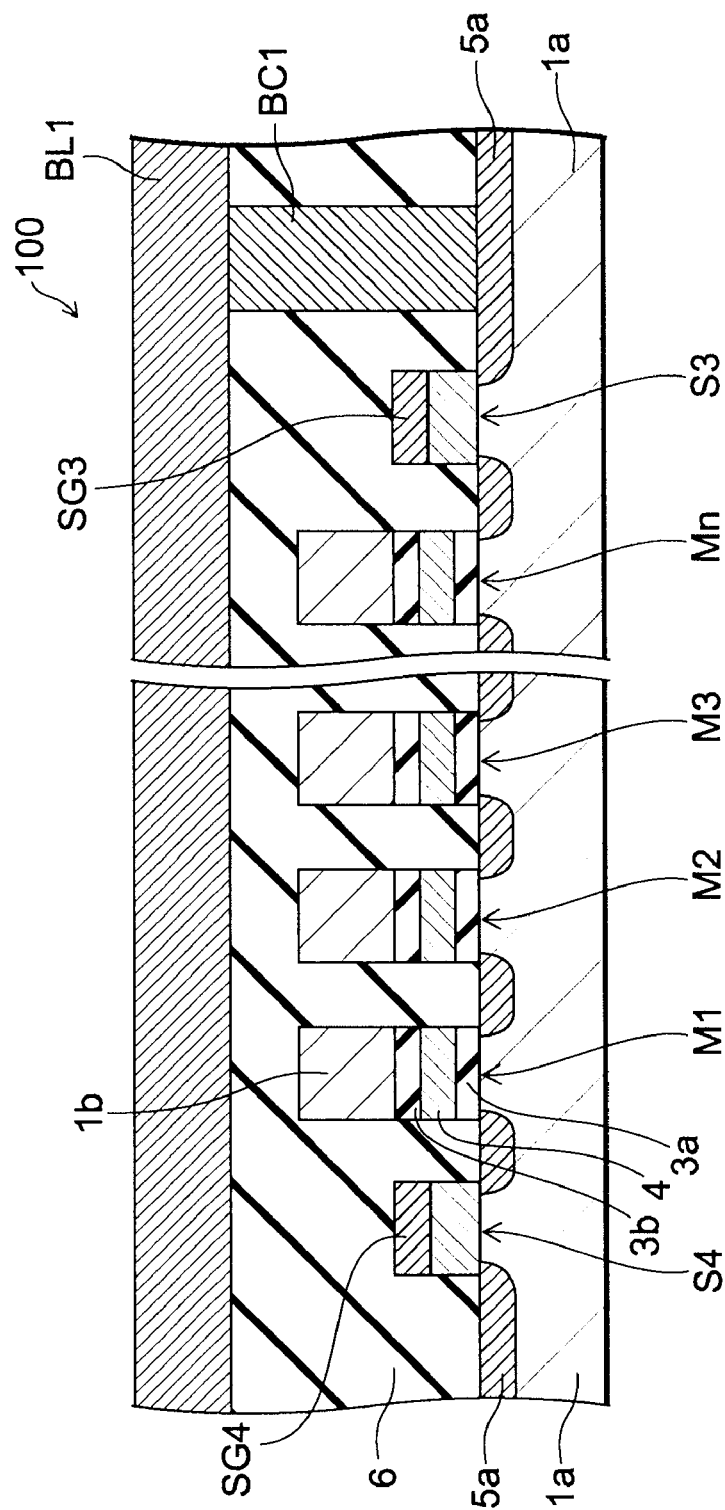
FIG. 5 is a schematic cross-sectional view in the column direction of a NAND string of the nonvolatile semiconductor memory device according to the first embodiment of the invention.

FIG. 5 is a schematic cross-sectional view in the column direction of a NAND string of the nonvolatile semiconductor memory device according to the first embodiment of the invention.

More specifically, FIG. 4 is a cross-sectional view including a cross section taken along line A-A' in FIG. 3, and corresponds to the row direction, or word line WL, of the NAND string. FIG. 5 is a cross-sectional view including a cross section taken along line B-B' in FIG. 3, and corresponds to the column direction, or bit line BL, of the NAND string.

As shown in FIG. 4, a plurality of floating gate memory cells (N1-Nm) are arranged on the semiconductor substrate 1a. The surface portion of the semiconductor substrate 1a is electrically isolated by device isolation films 2 corresponding to the respective memory cells (N1-Nm). The memory cells (N1-Nm) are connected by the semiconductor layer 1b, and source/drain diffusion layers 5b are provided on the memory cell side of the semiconductor layer 1b and between the memory cells.

On the other hand, as shown in FIG. 5, the semiconductor layer 1b of each memory cell (M1-Mm) is electrically isolated from the adjacent NAND string. Source/drain diffusion layers 5a are provided in the surface portion of the semiconductor substrate 1a below the portion between the semiconductor layers 1b.

As shown in FIGS. 4 and 5, select transistors S1-S4 can be made of conventional MOSFETs. The gate electrodes of these select transistors S1-S4 correspond to select gates SG1-SG4, respectively.

An interlayer insulating film 6 (e.g., silicon dioxide) is thickly deposited on the floating gate memory cells and the select transistors S1-S4 described above.

As shown in FIG. 4, a word line WL1 is connected through a word line contact WC1 to the source/drain diffusion layer 5b adjacent to the select transistor S1. Likewise, a word line WL2 is connected through a word line contact WC2 to the source/drain diffusion layer 5b adjacent to the select transistor S2. It is noted that the word line contact WC2 and the word line WL2 are not shown to avoid complication. A bit line BL1 is located in the interlayer insulating film 6 between the word line WL1 and the semiconductor layer 1b, although not shown in FIG. 4.

Furthermore, as shown in FIG. 5, a bit line BL1 is connected through a bit line contact BC1 to the source/drain diffusion layer 5a adjacent to the select transistor S3. Likewise, a bit line BL2 is connected through a bit line contact BC2 to the source/drain diffusion layer 5a adjacent to the select transistor S4. It is noted again that the bit line contact BC2 and the bit line BL2 are not shown to avoid complication.

FIG. 6 is a schematic cross-sectional view for describing the function of the nonvolatile semiconductor memory device according to the first embodiment of the invention.

That is, this figure illustrates the state of charge in a memory cell of the nonvolatile semiconductor memory device 100 according to this embodiment.

FIG. 6A shows an example state of charge, illustrating the state where no charge is stored in the charge storage layer 4.

FIG. 6B illustrates another state of charge, where charge 9a is stored on the side of the charge storage layer 4 near to the semiconductor substrate 1a.

FIG. 6C illustrates still another state of charge, where charge 9b is stored on the side of the charge storage layer 4 far from the semiconductor substrate 1a, that is, the side near to the semiconductor layer 1b.

FIG. 6D illustrates still another state of charge, where charge 9b and charge 9a are stored on the side of the charge storage layer 4 near to the semiconductor substrate 1a and the side near to the semiconductor layer 1b.

Thus, in the nonvolatile semiconductor memory device 100, charge can be stored at different positions in the thickness direction of the charge storage layer 4, and the position of the stored charge in the thickness direction can be read. More specifically, in conventional nonvolatile semiconductor memory devices, the threshold variation of the transistor on the semiconductor substrate 1a side associated with the amount of charge stored in the charge storage layer 4 is detected and used to record and read information. In contrast, in the nonvolatile semiconductor memory device 100 according to this embodiment, a transistor on the semiconductor substrate 1a side and a transistor on the semiconductor layer 1b side are provided above and below the memory cell, and by detecting the thresholds of these transistors, the amount of charge stored in the charge storage layer 4 and its position in the thickness direction can both be used as information. Thus, the information density can be significantly increased as compared with conventional techniques.

That is, in the nonvolatile semiconductor memory device 100, in addition to the amount of charge retained in the memory cell, the position of the charge in the direction perpendicular to the layer plane of the charge storage layer 4, that is, the position of the charge in the direction perpendicular to the channel, can be retrieved as additional information, which enables multilevel operation with a larger number of levels.

Thus, this embodiment can provide a nonvolatile semiconductor memory device 100 in which the position of charge retained in the memory cell in the direction perpendicular to the channel is used as information.

In the following, the operation and the driving method of the nonvolatile semiconductor memory device according to this embodiment are described in detail.

Second Embodiment

In the following, as a second embodiment of the invention, a method for reading a nonvolatile semiconductor memory device is described.

That is, a description is given of a method for reading a threshold for multilevel operation based on the information on charge position in the memory cell of the nonvolatile semiconductor memory device 100.

Figure 7:
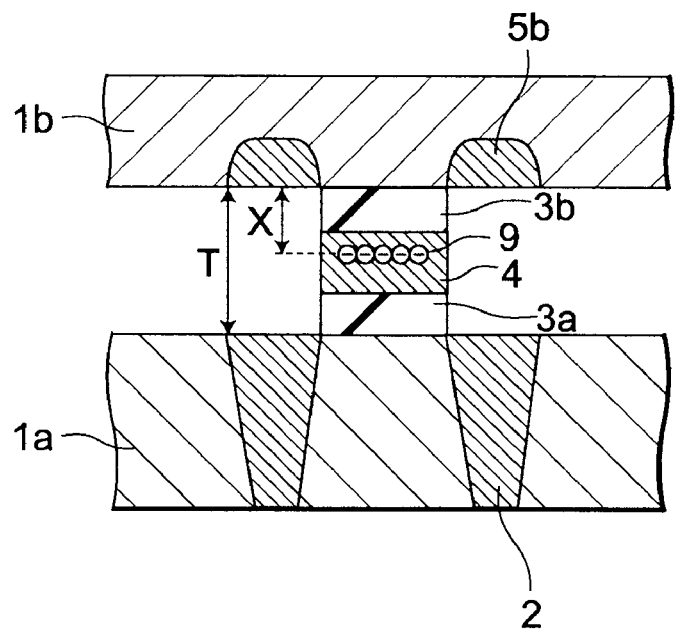
FIG. 7 is a schematic cross-sectional view for describing a method for driving a nonvolatile semiconductor memory device according to a second embodiment of the invention.

FIG. 7 is a schematic cross-sectional view for describing a method for driving a nonvolatile semiconductor memory device according to the second embodiment of the invention.

That is, FIG. 7 illustrates charge position in the nonvolatile semiconductor memory device 100, showing a NAND string along the extending direction of the semiconductor layer 1b with regard to a single memory cell.

As shown in FIG. 7, charge 9 is stored in the charge storage layer 4.

To read the threshold of the transistor formed in the semiconductor substrate 1a, a voltage is applied to the semiconductor layer 1b. Then, a channel is formed in the surface of the semiconductor substrate 1a of the relevant memory cell, and a current flows through the semiconductor substrate 1a. Hence, the threshold on the semiconductor substrate 1a side can be read.

On the other hand, to read the threshold of the transistor formed in the semiconductor layer 1b, a voltage is applied to the semiconductor substrate 1a. Then, a channel is formed in the surface of the semiconductor layer 1b of the relevant memory cell, and a current flows through the semiconductor layer 1b. Hence, the threshold on the semiconductor layer 1b side can be read.

In the driving method, or reading method, of this embodiment, the threshold detected on the semiconductor substrate 1a side and the threshold detected on the semiconductor layer 1b side are used to determine the memory state of information in the relevant memory cell.

The threshold detected on the semiconductor substrate 1a side and the threshold detected on the semiconductor layer 1b side are useful in extracting information corresponding to not only the charge amount but also the charge position in the relevant memory cell. In the following, this fact is described with reference to the charge amount and the charge position in the relevant memory cell illustrated in FIG. 7.

As shown in FIG. 7, the equivalent oxide thickness (hereinafter referred to as EOT) of the memory cell is denoted by T, and the charge position with reference to the semiconductor layer 1b (the position of charge 9 in the direction perpendicular to the surface of the semiconductor substrate 1a) is denoted by x (x is expressed in terms of EOT).

Reference values are associated with the threshold detected on the semiconductor substrate 1a side and the threshold detected on the semiconductor layer 1b side. The deviation of the threshold detected on the semiconductor substrate 1a side from the associated reference value is denoted by $\Delta V_T(\text{sub})$. The deviation of the threshold detected on the semiconductor layer 1b side from the associated reference value is denoted by $\Delta V_T(\text{poly})$. The surface density of the amount of charge retained in the relevant memory cell is evaluated as the deviation of the threshold from the reference state and denoted by $\Delta Q$. Then, $\Delta V_T(\text{sub})$ and $\Delta V_T(\text{poly})$ are given by the following equations (1) and (2):

$$\Delta V_T(\text{sub}) = -\frac{x\Delta Q}{\varepsilon_{OX}} \quad (1)$$

$$\Delta V_T(\text{poly}) = -\frac{(T-x)\Delta Q}{\varepsilon_{OX}} \quad (2)$$

The equations (1) and (2) yield the charge amount $\Delta Q$ and the charge position x expressed by the following equations (3) and (4):

$$\Delta Q = -\frac{\varepsilon_{OX}}{T}(\Delta V_T(\text{sub}) + \Delta V_T(\text{poly})) \quad (3)$$

$$x = T\frac{\Delta V_T(\text{sub})}{\Delta V_T(\text{sub}) + \Delta V_T(\text{poly})} \quad (4)$$

For example, in conventional methods for driving a nonvolatile semiconductor memory device, the threshold of a single memory cell is read only by means of the equation (1), and hence the charge amount and the charge position cannot be distinguished from each other as independent variables. In contrast, in the driving method according to this embodiment, the charge amount and the charge position can be treated as independent variables as given by the equations (3) and (4). Hence, it is possible to read additional information that cannot be provided by the conventional methods for reading a single threshold.

Thus, this embodiment can provide a method for driving a nonvolatile semiconductor memory device in which the position of charge retained in the memory cell in the direction perpendicular to the channel is used as information.

Third Embodiment

In the following, as a third embodiment of the invention, a method for programming and erasing a nonvolatile semiconductor memory device is described. That is, a description is given of a method for programming and erasing a memory cell in the above nonvolatile semiconductor memory device 100.

Figure 8:
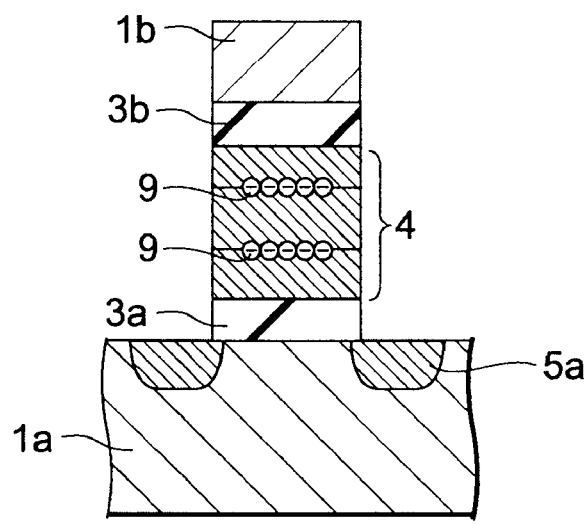
FIG. 8 is a schematic cross-sectional view for describing a method for driving a nonvolatile semiconductor memory device according to a third embodiment of the invention.

FIG. 8 is a schematic cross-sectional view for describing a method for driving a nonvolatile semiconductor memory device according to the third embodiment of the invention.

That is, FIG. 8 illustrates charge position in the nonvolatile semiconductor memory device 100, showing a NAND string along the extending direction of the semiconductor layer 1b with regard to a single memory cell.

As shown in FIG. 8, the source/drain diffusion layers 5a are provided, spaced from each other, in the surface of the semiconductor substrate 1a. The first insulating film 3a, the charge storage layer 4, and the second insulating film 3b are provided above the portion between the source/drain diffusion layers 5a, and the semiconductor layer 1b is provided on the second insulating film 3b.

For programming in the driving method of this embodiment, the semiconductor layer 1b is positively biased to inject electrons from the semiconductor substrate 1a. Furthermore, the semiconductor substrate 1a is positively biased to inject electrons from the semiconductor layer 1b.

On the other hand, for erasing in the driving method of this embodiment, the semiconductor layer 1b is positively biased to inject holes from the semiconductor layer 1b. Furthermore, the semiconductor substrate 1a is positively biased to inject holes from the semiconductor substrate 1a.

An example of achieving both the above programming and erasing operation is as follows. The first insulating film 3a and the second insulating film 3b can be a stacked structure of insulating materials. By way of example, the first insulating film 3a can be a stacked structure of an $SiO_2$ film having a thickness of 1 nm, an SiN film having a thickness of 1.5 nm, and an $SiO_2$ film having a thickness of 3 nm, and the second insulating film 3b can be a stacked structure of an SiN film having a thickness of 1 nm, an $SiO_2$ film having a thickness of 4 nm, and an SiN film having a thickness of 2 nm. However, this is illustrative only, and the number of layers and the material used in each stacked structure can be variously modified.

Furthermore, the charge storage layer 4 can be made of a plurality of stacked layers. By way of example, the charge storage layer 4 can be a stacked structure of SiN film/AlO film/SiN film. However, this is illustrative only, and the number of layers and the material used in the above stacked structure can be variously modified.

In the case where the first insulating film 3a and the second insulating film 3b have a stacked structure, the electron current and the hole current flowing through the first insulating film 3a and the second insulating film 3b can be theoretically analyzed.

FIG. 9 is a graph illustrating the simulation results for the characteristics of the nonvolatile semiconductor memory device according to the embodiment of the invention.

Figure 9A:
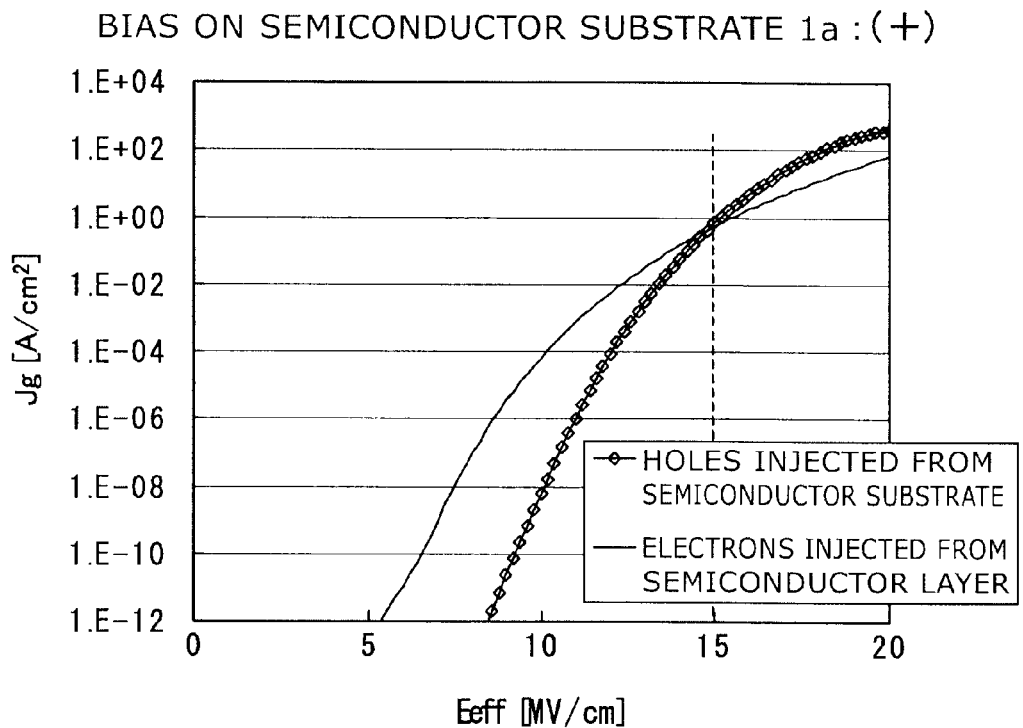
FIGS. 9A and 9B are graphs illustrating the simulation results for the characteristics of the nonvolatile semiconductor memory device according to the embodiment of the invention.

More specifically, FIG. 9A shows, in the nonvolatile semiconductor memory device 100, the hole current (current density) injected from the semiconductor substrate 1a and the electron current (current density) injected from the semiconductor layer 1b versus the equivalent oxide field in the case where the semiconductor substrate 1a is positively biased. That is, FIG. 9A illustrates the hole current flowing through the first insulating film 3a (hole current under substrate injection) and the electron current flowing through the second insulating film 3b (electron current under electrode injection) in the case where the semiconductor substrate 1a is positively biased.

Figure 9B:
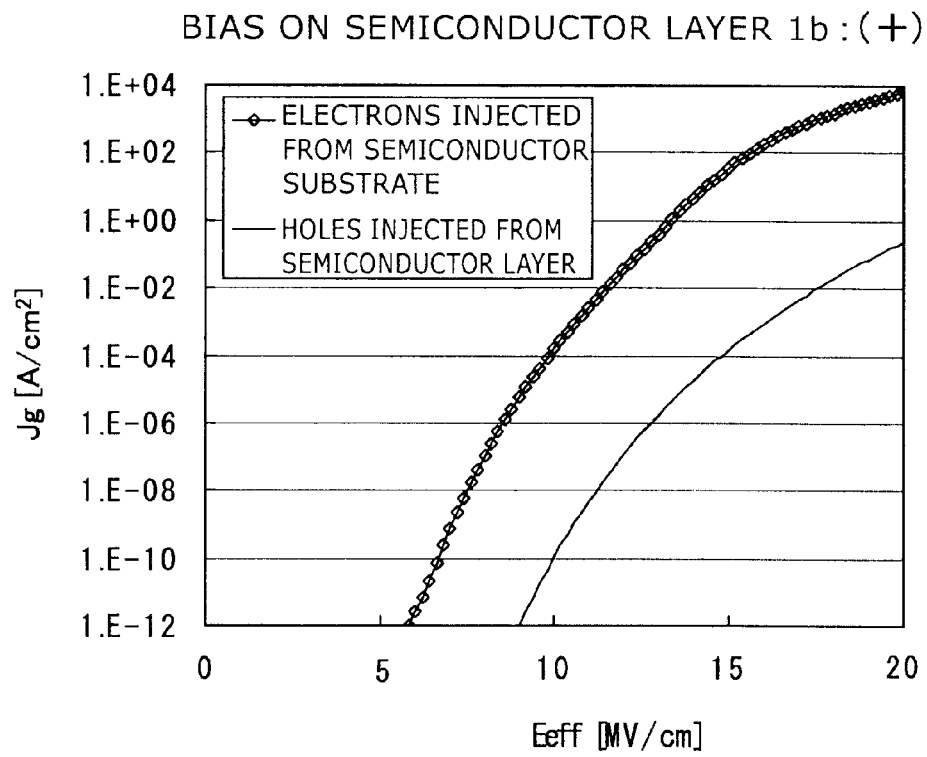

FIG. 9B shows, in the nonvolatile semiconductor memory device 100, the electron current (current density) injected from the semiconductor substrate 1a and the hole current (current density) injected from the semiconductor layer 1b versus the equivalent oxide field in the case where the semiconductor layer 1b is positively biased. That is, FIG. 9B illustrates the electron current flowing through the first insulating film 3a (electron current under substrate injection) and the hole current flowing through the second insulating film 3b (hole current under electrode injection) in the case where the semiconductor layer 1b is positively biased.

In FIGS. 9A and 9B, the horizontal axis represents equivalent oxide field Eeff (MV/cm), and the vertical axis represents current Jg (A/cm$^2$).

As shown in FIG. 9A, in the case where the semiconductor substrate 1a is positively biased, in the bias range of providing an equivalent oxide field Eeff of approximately 15 MV/cm or less, the electron current from the semiconductor layer 1b exceeds the hole current from the semiconductor substrate 1a, which allows programming of electrons.

As shown in FIG. 9B, in the case where the semiconductor layer 1b is positively biased, in the entire region of electric field, the electron current from the semiconductor substrate 1a exceeds the hole current from the semiconductor layer 1b, which allows programming of electrons.

As shown in FIG. 9A, in the case where the semiconductor substrate 1a is positively biased, in the bias range of providing an equivalent oxide field Eeff of approximately 15 MV/cm or more, the hole current from the semiconductor substrate 1a exceeds the electron current from the semiconductor layer 1b, which allows erasing.

The first insulating film 3a and the second insulating film 3b are not limited to the stacked structures, materials, and thickness configuration illustrated in FIG. 8, but various other materials and thickness configurations can be implemented.

The driving method according to this embodiment can be based on the equivalent oxide field which allows inversion of the magnitude relation of the hole current of one of the first insulating film 3a and the second insulating film 3b to the electron current of the other.

Furthermore, for example, for some materials and stacked structures of the first insulating film 3a and the second insulating film 3b, the electron current flowing through the first insulating film 3a is always larger than the hole current flowing through the second insulating film 3b when the semiconductor layer 1b is positively biased, and the hole current flowing through the first insulating film 3a is always larger than the electron current flowing through the second insulating film 3b when the semiconductor substrate 1a is positively biased. In this case, charge exchange occurs primarily between the semiconductor substrate 1a and the charge storage layer 4. Hence, programming can be performed by positively biasing the semiconductor layer 1b, and erasing can be performed by positively biasing the semiconductor substrate 1a.

For example, for some materials and stacked structures of the first insulating film 3a and the second insulating film 3b, the electron current flowing through the first insulating film 3a is always lower than the hole current flowing through the second insulating film 3b when the semiconductor layer 1b is positively biased, and the hole current flowing through the first insulating film 3a is always lower than the electron current flowing through the second insulating film 3b when the semiconductor substrate 1a is positively biased. In this case, charge exchange occurs primarily between the semiconductor layer 1b and the charge storage layer 4. Hence, programming can be performed by positively biasing the semiconductor substrate 1a, and erasing can be performed by positively biasing the semiconductor layer 1b.

In the nonvolatile semiconductor memory device according to this embodiment, when the potential of the semiconductor substrate 1a is higher than the potential of the semiconductor layer 1b, there is a potential such that the hole current injected from the semiconductor substrate 1a and flowing through the first insulating film 3a is larger than the electron current injected from the semiconductor layer 1b and flowing through the second insulating film 3b. When the potential of the semiconductor layer 1b is higher than the potential of the semiconductor substrate 1a, there is a potential such that the hole current injected from the semiconductor layer 1b and flowing through the second insulating film 3b is larger than the electron current injected from the semiconductor substrate 1a and flowing through the first insulating film 3a.

When the potential of the semiconductor layer 1b is higher than the potential of the semiconductor substrate 1a, a positive bias voltage is applied to the semiconductor layer 1b.

FIG. 10 is a schematic diagram illustrating the method for driving a nonvolatile semiconductor memory device according to the third embodiment of the invention.

Figure 10A:
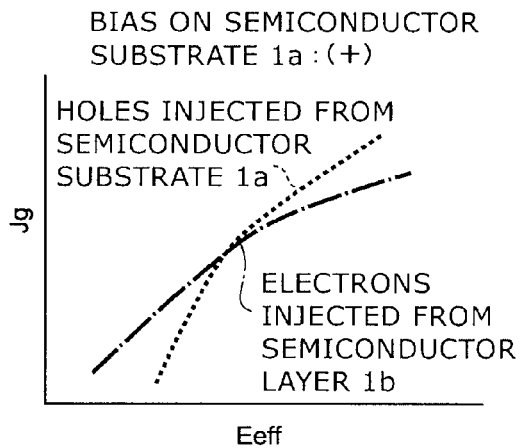
FIGS. 10A to 10D are schematic diagrams illustrating the method for driving a nonvolatile semiconductor memory device according to the third embodiment of the invention.
Figure 10B:
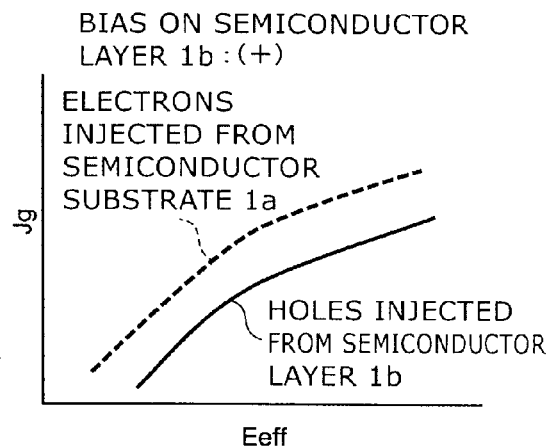

More specifically, FIGS. 10A and 10B illustrate the characteristics of an example nonvolatile semiconductor memory device 101 according to this embodiment. FIG. 10A shows the hole current (current density) injected from the semiconductor substrate 1a and the electron current (current density) injected from the semiconductor layer 1b versus the equivalent oxide field in the case where the semiconductor substrate 1a is positively biased. FIG. 10B shows the electron current (current density) injected from the semiconductor substrate 1a and the hole current (current density) injected from the semiconductor layer 1b versus the equivalent oxide field in the case where the semiconductor layer 1b is positively biased.

Figure 10C:
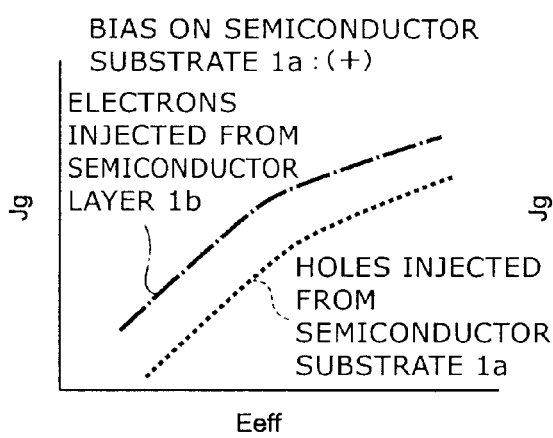
Figure 10D:
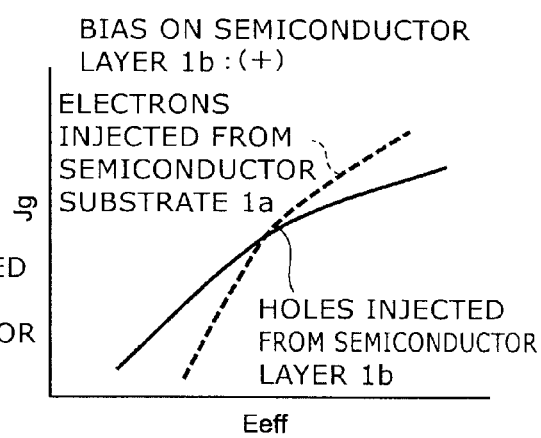

FIGS. 10C and 10D illustrate the characteristics of another nonvolatile semiconductor memory device 102 according to this embodiment, showing the cases where the semiconductor substrate 1a and the semiconductor layer 1b are positively biased, respectively.

FIG. 11 is a schematic diagram illustrating another method for driving a nonvolatile semiconductor memory device according to the third embodiment of the invention.

Figure 11A:
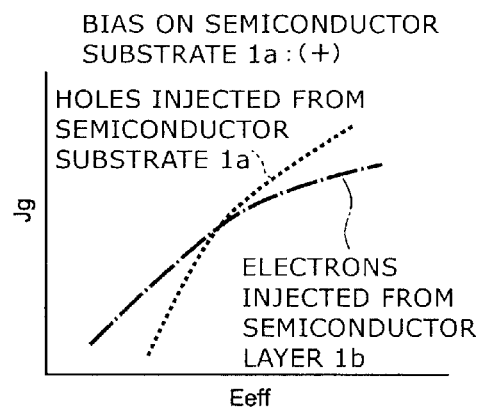
FIGS. 11A to 11D are schematic diagrams illustrating another method for driving a nonvolatile semiconductor memory device according to the third embodiment of the invention.
Figure 11B:
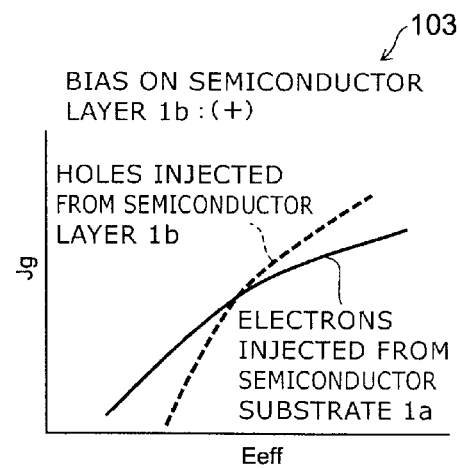

More specifically, FIGS. 11A and 11B illustrate the characteristics of still another nonvolatile semiconductor memory device 103 according to this embodiment, showing the cases where the semiconductor substrate 1a and the semiconductor layer 1b are positively biased, respectively.

Figure 11C:
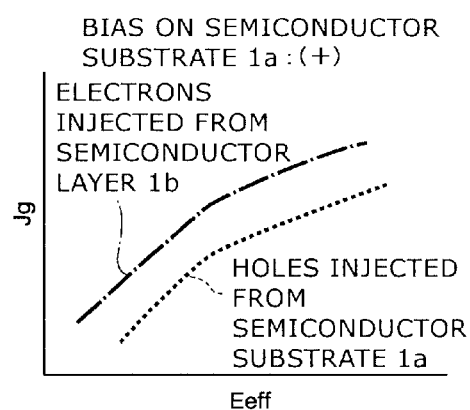
Figure 11D:
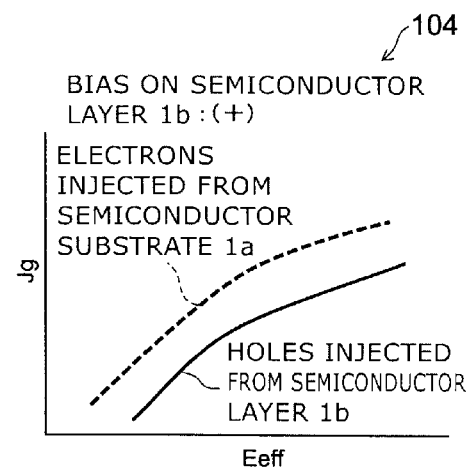

FIGS. 11C and 11D illustrate the characteristics of still another nonvolatile semiconductor memory device 104 according to this embodiment, showing the cases where the semiconductor substrate 1a and the semiconductor layer 1b are positively biased, respectively.

That is, FIGS. 10A-10D and 11A-11D illustrate the characteristics of four types of nonvolatile semiconductor memory devices according to this embodiment.

As shown in FIGS. 10A and 10B, in the nonvolatile semiconductor memory device 101, when a positive bias voltage is applied to the semiconductor substrate 1a, at low field, the electron current injected from the semiconductor layer 1b is larger than the hole current injected from the semiconductor substrate 1a, and at high field, the electron current injected from the semiconductor layer 1b is lower than the hole current injected from the semiconductor substrate 1a. When a positive bias voltage is applied to the semiconductor layer 1b, at both low field and high field, the electron current injected from the semiconductor substrate 1a is larger than the hole current injected from the semiconductor layer 1b. In this case, erasing is difficult to perform from the semiconductor layer 1b side, and can be performed from the semiconductor substrate 1a side. Here, the insulating film between a plurality of charge storage positions is preferably selected to be less likely to block holes.

As shown in FIGS. 10C and 10D, in the nonvolatile semiconductor memory device 102, when a positive bias voltage is applied to the semiconductor substrate 1a, at both low field and high field, the electron current injected from the semiconductor layer 1b is larger than the hole current injected from the semiconductor substrate 1a. When a positive bias voltage is applied to the semiconductor layer 1b, at low field, the hole current injected from the semiconductor layer 1b is larger than the electron current injected from the semiconductor substrate 1a, and at high field, the hole current injected from the semiconductor layer 1b is lower than the electron current injected from the semiconductor substrate 1a. In this case, erasing is difficult to perform from the semiconductor substrate 1a side, and can be performed from the semiconductor layer 1b side. Here, the insulating film between a plurality of charge storage positions is preferably selected to be less likely to block holes.

As shown in FIGS. 11A and 11B, in the nonvolatile semiconductor memory device 103, when a positive bias voltage is applied to the semiconductor substrate 1a, at low field, the electron current injected from the semiconductor layer 1b is larger than the hole current injected from the semiconductor substrate 1a, and at high field, the electron current injected from the semiconductor layer 1b is lower than the hole current injected from the semiconductor substrate 1a. When a positive bias voltage is applied to the semiconductor layer 1b, at low field, the electron current injected from the semiconductor substrate 1a is larger than the hole current injected from the semiconductor layer 1b, and at high field, the electron current injected from the semiconductor substrate 1a is lower than the hole current injected from the semiconductor layer 1b. In this case, erasing can be performed from either of the semiconductor substrate 1a side and the semiconductor layer 1b side.

That is, erasing may be performed from each of the semiconductor substrate 1a side and the semiconductor layer 1b side. In this case, the insulating film between a plurality of charge storage positions may be selected to be less likely to block holes, or may be selected to block holes. Alternatively, erasing may be performed only from the semiconductor substrate 1a side, or only from the semiconductor layer 1b side. In this case, the insulating film between a plurality of charge storage positions is preferably selected to be less likely to block holes.

As shown in FIGS. 11C and 11D, in the nonvolatile semiconductor memory device 104, when a positive bias voltage is applied to the semiconductor substrate 1a, at both low field and high field, the electron current injected from the semiconductor layer 1b is larger than the hole current injected from the semiconductor substrate 1a. When a positive bias voltage is applied to the semiconductor layer 1b, at both low field and high field, the electron current injected from the semiconductor substrate 1a is larger than the hole current injected from the semiconductor layer 1b. In this case, erasing is difficult to perform from either of the semiconductor substrate 1a side and the semiconductor layer 1b side, and can be performed by irradiating the nonvolatile semiconductor memory device 104 with ultraviolet radiation and the like.

In the foregoing, the insulating film less likely to block holes can be realized illustratively by the following configurations. For example, in the case where the charge storage layer 4 has a three-layer stacked structure of a lower, intermediate, and upper layer, the lower and upper layer can be made of a material having a high energy barrier such as $SiO_2$, $Al_2O_3$, and $HfO_2$, and the intermediate layer can be made of a material having a low energy barrier such as $Si_3N_4$, $La_2O_3$, $Y_2O_3$, and STO ($SrTiO_3$). Alternatively, the lower, intermediate, and upper layer can be illustratively made of a material having a low energy barrier.

On the other hand, the insulating film likely to block holes can be realized illustratively by the following configurations. For example, in the case where the charge storage layer 4 has a three-layer stacked structure of a lower, intermediate, and upper layer, the lower and upper layer can be made of a material having a low energy barrier such as $Si_3N_4$, $La_2O_3$, $Y_2O_3$, and STO ($SrTiO_3$), and the intermediate layer can be made of a material having a high energy barrier such as $SiO_2$, $Al_2O_3$, and $HfO_2$. Alternatively, the lower, intermediate, and upper layer can be illustratively made of a material having a high energy barrier.

The thickness of each of the aforementioned lower, intermediate, and upper layer can be illustratively 0.5 to 20 nm.

Like the hole-blocking characteristics of the insulating film between a plurality of charge storage positions described above, the electron-blocking characteristics can be adapted to the characteristics of the charge storage layer 4.

Furthermore, the nonvolatile semiconductor memory device according to this embodiment can be variously modified.

FIG. 12 is a schematic diagram illustrating the characteristics of a nonvolatile semiconductor memory device according to a variation of the third embodiment of the invention.

More specifically, FIGS. 12A-12D show the hole current (current density) injected from the semiconductor substrate 1a and the electron current (current density) injected from the semiconductor layer 1b versus the equivalent oxide field in the case where the semiconductor substrate 1a is positively biased. FIGS. 12E-12H show the electron current (current density) injected from the semiconductor substrate 1a and the hole current (current density) injected from the semiconductor layer 1b versus the equivalent oxide field in the case where the semiconductor layer 1b is positively biased.

Figure 12A:
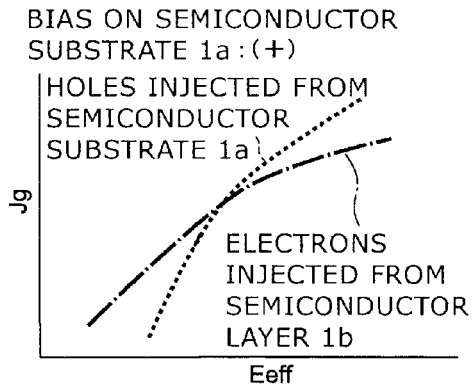
FIGS. 12A to 12H are schematic diagrams illustrating the characteristics of a nonvolatile semiconductor memory device according to a variation of the third embodiment of the invention.

As shown in FIG. 12A, in a characteristic of the nonvolatile semiconductor memory device according to this embodiment, when a positive bias voltage is applied to the semiconductor substrate 1a, at low field, the electron current injected from the semiconductor layer 1b is larger than the hole current injected from the semiconductor substrate 1a, and at high field, the electron current injected from the semiconductor layer 1b is lower than the hole current injected from the semiconductor substrate 1a.

Figure 12B:
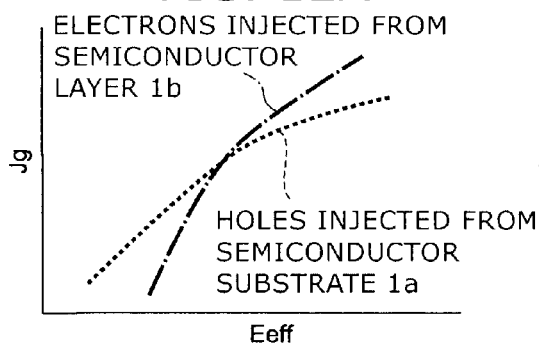

As shown in FIG. 12B, in another characteristic, when a positive bias voltage is applied to the semiconductor substrate 1a, at low field, the electron current injected from the semiconductor layer 1b is lower than the hole current injected from the semiconductor substrate 1a, and at high field, the electron current injected from the semiconductor layer 1b is larger than the hole current injected from the semiconductor substrate 1a.

Figure 12C:
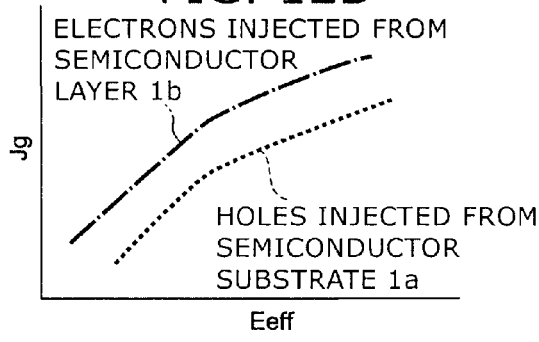

As shown in FIG. 12C, in still another characteristic, when a positive bias voltage is applied to the semiconductor substrate 1a, at both low field and high field, the electron current injected from the semiconductor layer 1b is larger than the hole current injected from the semiconductor substrate 1a.

Figure 12D:
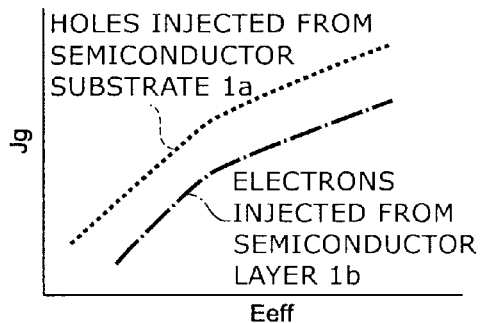

As shown in FIG. 12D, in still another characteristic, when a positive bias voltage is applied to the semiconductor substrate 1a, at both low field and high field, the electron current injected from the semiconductor layer 1b is lower than the hole current injected from the semiconductor substrate 1a.

Figure 12E:
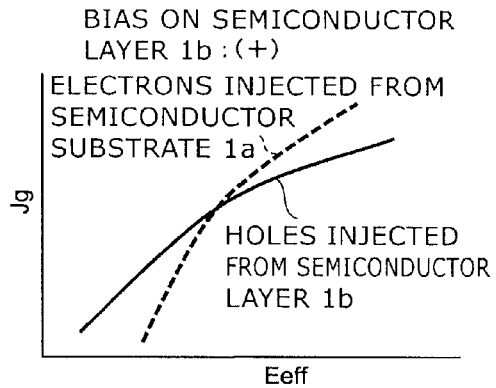

On the other hand, as shown in FIG. 12E, in a characteristic of the nonvolatile semiconductor memory device according to this embodiment, when a positive bias voltage is applied to the semiconductor layer 1b, at low field, the hole current injected from the semiconductor layer 1b is larger than the electron current injected from the semiconductor substrate 1a, and at high field, the hole current injected from the semiconductor layer 1b is lower than the electron current injected from the semiconductor substrate 1a.

Figure 12F:
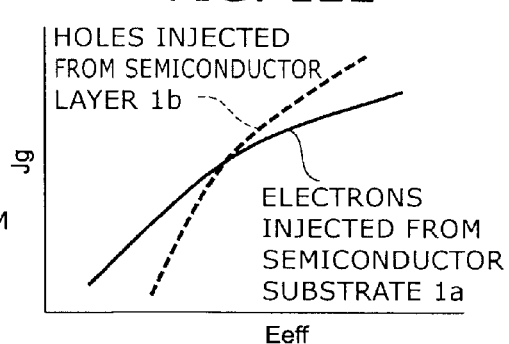

As shown in FIG. 12F, in another characteristic, when a positive bias voltage is applied to the semiconductor layer 1b, at low field, the hole current injected from the semiconductor layer 1b is lower than the electron current injected from the semiconductor substrate 1a, and at high field, the hole current injected from the semiconductor layer 1b is larger than the electron current injected from the semiconductor substrate 1a.

Figure 12G:
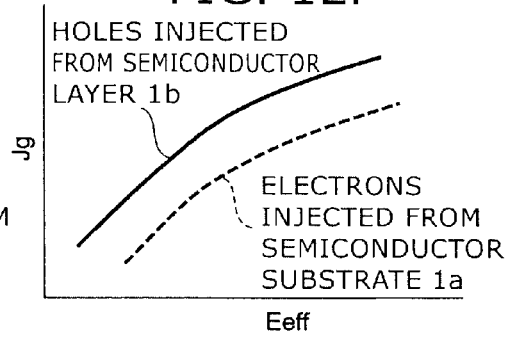

As shown in FIG. 12G, in still another characteristic, when a positive bias voltage is applied to the semiconductor layer 1b, at both low field and high field, the hole current injected from the semiconductor layer 1b is larger than the electron current injected from the semiconductor substrate 1a.

Figure 12H:
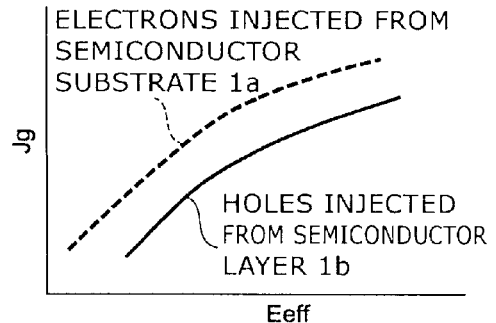

As shown in FIG. 12H, in still another characteristic, when a positive bias voltage is applied to the semiconductor layer 1b, at both low field and high field, the hole current injected from the semiconductor layer 1b is lower than the electron current injected from the semiconductor substrate 1a.

Then, driving can be illustratively based on each combination of the characteristic illustrated in FIG. 12A with the characteristics illustrated in FIGS. 12E, 12F, 12G, and 12H.

Furthermore, driving can be illustratively based on each combination of the characteristic illustrated in FIG. 12B with the characteristics illustrated in FIGS. 12E, 12F, 12G, and 12H.

Furthermore, driving can be illustratively based on each combination of the characteristic illustrated in FIG. 12C with the characteristics illustrated in FIGS. 12E, 12F, and 12G.

Furthermore, driving can be illustratively based on each combination of the characteristic illustrated in FIG. 12D with the characteristics illustrated in FIGS. 12E, 12F, and 12H.

Among the above various combinations, the combination of FIGS. 12A and 12H corresponds to the characteristics illustrated in FIGS. 10A and 10B.

Furthermore, among the above various combinations, the combination of FIGS. 12C and 12E corresponds to the characteristics illustrated in FIGS. 10C and 10D.

Furthermore, among the above various combinations, the combination of FIGS. 12A and 12F corresponds to the characteristics illustrated in FIGS. 11A and 11B.

Furthermore, among the above various combinations, the combination of FIGS. 12C and 12H corresponds to the characteristics illustrated in FIGS. 11C and 11D.

The nonvolatile semiconductor memory device according to this embodiment can be driven by driving methods adapted to the various combinations of characteristics illustrated in FIGS. 12A-12H.

Thus, this embodiment can provide a method for driving a nonvolatile semiconductor memory device in which the position of charge retained in the memory cell in the direction perpendicular to the channel is used as information.

Fourth Embodiment

Figure 13:
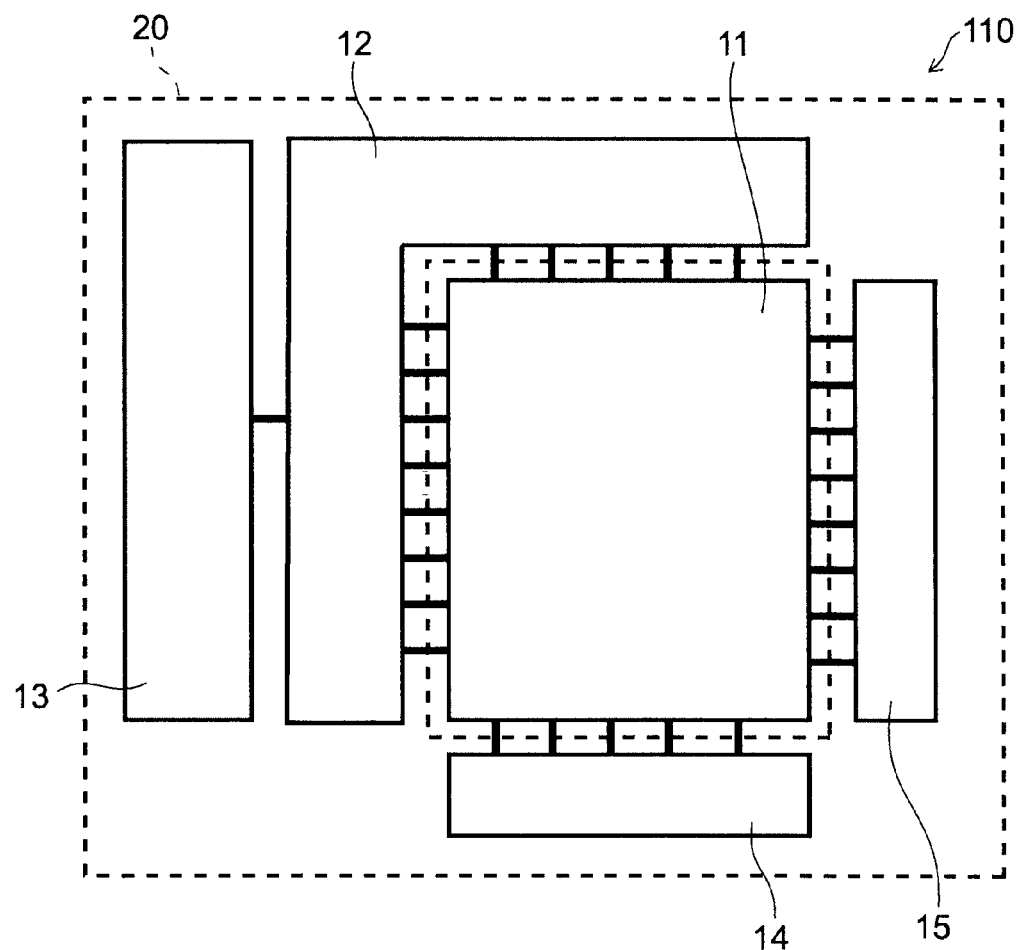
FIG. 13 is a schematic view illustrating the configuration of a nonvolatile semiconductor memory device according to a fourth embodiment of the invention.

FIG. 13 is a schematic view illustrating the configuration of a nonvolatile semiconductor memory device according to a fourth embodiment of the invention.

More specifically, this figure illustrates the circuit configuration of a nonvolatile semiconductor memory device 110 according to this embodiment.

As shown in FIG. 13, the nonvolatile semiconductor memory device 110 according to this embodiment includes a memory cell array 11 housing memory cells, and a peripheral circuit 20 that illustratively generates voltages adapted to the driving method according to the second and third embodiment. The peripheral circuit 20 includes a voltage control circuit 12, a voltage generation circuit 13, a first read circuit 14 for reading on the semiconductor substrate 1a side, and a second read circuit 15 for reading on the semiconductor layer 1b side.

More specifically, the nonvolatile semiconductor memory device 110 further comprises a peripheral circuit 20 which includes a voltage generation circuit 13 for generating voltages to be applied to the semiconductor substrate 1a and the semiconductor layer 1b, a voltage control circuit 12 for applying the voltages to the semiconductor substrate 1a and the semiconductor layer 1b, a first read circuit 14 for reading the threshold of a transistor including the first channel 8a upon application of the aforementioned voltage to the semiconductor layer 1b, and a second read circuit 15 for reading the threshold of a transistor including the second channel 8b upon application of the aforementioned voltage to the semiconductor substrate 1a. Thus, the nonvolatile semiconductor memory device 110 can detect the position of charge retained in the charge storage layer (charge retention layer) 4 in the direction perpendicular to the layer plane of the charge storage layer 4 (the position of the charge in the direction perpendicular to the channel). That is, information corresponding to the storage state of charge retained in the charge retention layer 4 is outputted.

The first and second read circuit 14, 15 serve to identify the memory state of each memory cell. Specifically, they serve to identify the memory state of each memory cell by reading the threshold of the transistor on the semiconductor substrate 1a side and the threshold of the transistor on the semiconductor layer 1b side as described in the second embodiment.

In the following description, by way of example, it is assumed that four bits of information per memory cell can be programmed.

FIG. 14 is a schematic diagram for describing the method for driving a nonvolatile semiconductor memory device according to the fourth embodiment of the invention.

More specifically, FIG. 14A shows how four bits of information are assigned to the combinations of the thresholds on the semiconductor substrate 1a side and the charge positions. FIG. 14B shows how four bits of information are assigned to the combinations of the thresholds on the semiconductor substrate 1a side and the thresholds on the semiconductor layer 1b side.

It is assumed that the threshold of the transistor on the semiconductor substrate 1a side can be read at four levels, that is, $V_T(sub)_1, V_T(sub)_2, V_T(sub)_3,$ and $V_T(sub)_4$. Likewise, it is assumed that the threshold of the transistor on the semiconductor layer 1b side can also be read at four levels, that is, $V_T(poly)_1, V_T(poly)_2, V_T(poly)_3,$ and $V_T(poly)_4$. Here, the equation (4) can be used to also identify the charge position at four levels, that is, $x_1, x_2, x_3,$ and $x_4$.

In the nonvolatile semiconductor memory device 110 and a method for driving the same according to this embodiment, the first and second read circuit 14, 15 serve to assign four bits of information using all the combinations of the thresholds of the transistor on the semiconductor substrate 1a side, $V_T(sub)_1 - V_T(sub)_4$, and $x_1 - x_4$.

In the nonvolatile semiconductor memory device 110 and another method for driving the same according to this embodiment, the first and second read circuit 14, 15 serve to assign four bits of information using all the combinations of the thresholds of the transistor on the semiconductor substrate 1a side, $V_T(sub)_1 - V_T(sub)_4$, and the thresholds of the transistor on the semiconductor layer 1b side, $V_T(poly)_1 - V_T(poly)_4$.

Thus, this embodiment can provide a nonvolatile semiconductor memory device and a method for driving the same in which the position of charge retained in the memory cell in the direction perpendicular to the channel is used as information.

In the nonvolatile semiconductor memory device and the method for driving the same according to this embodiment, the threshold of the transistor on the semiconductor substrate 1a side and the transistor on the semiconductor layer 1b side does not necessarily need to take four levels. For example, it may take one, two, or three levels. Furthermore, the nonvolatile semiconductor memory device and the method for driving the same according to this embodiment are also applicable to the number of states of five or more levels.

A nonvolatile semiconductor memory device according to an aspect of the invention comprises a memory cell which includes source/drain diffusion layers formed with a spacing therebetween in a surface portion of a semiconductor substrate, a stacked insulating film including a charge storage layer formed on a channel between the source/drain diffusion layers, and a semiconductor layer formed on the stacked insulating film, where source/drain diffusion layers are formed with a spacing therebetween in a surface portion of the semiconductor layer on the stacked insulating film side, and the stacked insulating film is located between the source/drain diffusion layers of the semiconductor layer.

A nonvolatile semiconductor memory device according to another aspect of the invention comprises a memory cell which includes source/drain diffusion layers formed with a spacing therebetween in a surface portion of a semiconductor substrate, a lower insulating film formed on a channel between the source/drain diffusion layers, a floating electrode formed on the lower insulating film, an upper insulating film formed on the floating electrode, and a semiconductor layer formed on the upper insulating film, where source/drain diffusion layers are formed with a spacing therebetween in a surface portion of the semiconductor layer on the upper insulating film side, and the floating electrode, the upper insulating film, and the lower insulating film are located between the source/drain diffusion layers of the semiconductor layer.

To detect the charge distribution in the direction perpendicular to the channel of the memory cell, the memory state of the memory cell is retrieved by applying a voltage to the semiconductor substrate to read the threshold of the transistor in the semiconductor layer in addition to applying a voltage to the semiconductor layer to read the threshold of the transistor in the semiconductor substrate.

To control the charge distribution of electrons in the direction perpendicular to the channel of the memory cell, the memory state of the memory cell is changed by applying a positive voltage to the semiconductor layer to inject electrons from the semiconductor substrate and applying a positive voltage to the semiconductor substrate to inject electrons from the semiconductor layer.

To erase the charge distribution of electrons in the direction perpendicular to the channel of the memory cell, a voltage application condition is established where the hole current passing through the insulating film immediately above the semiconductor substrate exceeds the electron current passing through the insulating film immediately below the semiconductor layer, or a voltage application condition is established where, in the case of injecting holes from the semiconductor layer, the hole current passing through the insulating film immediately below the semiconductor layer exceeds the electron current passing through the insulating film immediately above the semiconductor substrate.

Another aspect of the invention provides a nonvolatile semiconductor memory device operable to read information corresponding to the position of charge in the direction perpendicular to the channel by reading each of the threshold of a first channel and the threshold of a second channel.

Thus, in addition to the amount of charge retained in the memory cell, the position of the charge in the direction perpendicular to the channel can be retrieved as additional information, which enables multilevel operation with a larger number of levels.

In the embodiments described above, the charge storage layer 4 serving as a charge retention layer can be replaced by a floating dot layer or a floating electrode. Also in such cases, the effect of the embodiments of the invention can be achieved, and it is possible to provide a nonvolatile semiconductor memory device and a method for driving the same in which the position of charge retained in the memory cell in the direction perpendicular to the channel is used as information.

The embodiments of the invention have been described with reference to examples. However, the invention is not limited to these examples. For instance, various specific configurations of the components constituting the nonvolatile semiconductor memory device and the method for driving the same are encompassed within the scope of the invention as long as those skilled in the art can similarly practice the invention and achieve similar effects by suitably selecting such configurations from conventionally known ones.

Furthermore, any two or more components of the examples can be combined with each other as long as technically feasible, and such combinations are also encompassed within the scope of the invention as long as they fall within the spirit of the invention.

Furthermore, those skilled in the art can suitably modify and implement the nonvolatile semiconductor memory device and the method for driving the same described above in the embodiments of the invention, and any nonvolatile semiconductor memory device and method for driving the same thus modified are also encompassed within the scope of the invention as long as they fall within the spirit of the invention.

Furthermore, those skilled in the art can conceive various modifications and variations within the spirit of the invention, and it is understood that such modifications and variations are also encompassed within the scope of the invention.

The invention claimed is:

1. A nonvolatile semiconductor memory device comprising:
 a semiconductor substrate including a first channel, and a source region and a drain region provided on both sides of the first channel;
 a first insulating film provided on and in direct contact with the first channel;
 a charge retention layer provided on the first insulating film;
 a second insulating film provided on the charge retention layer; and
 a semiconductor layer including a second channel provided on and in direct contact with the second insulating film, and a source region and a drain region provided on both sides of the second channel.

2. The memory device according to claim 1, wherein the charge retention layer includes a charge storage layer.

3. The memory device according to claim 1, wherein the charge retention layer includes a stacked structure of a plurality of insulating films and one of the insulating films is a charge storage layer.

4. The memory device according to claim 1, wherein the charge retention layer includes a floating dot layer in which semiconductor or metal particles are dispersed in an insulating material.

5. The memory device according to claim 1, wherein the charge retention layer includes a stacked structure of a plurality of insulating films and one of the insulating films includes a floating dot layer in which semiconductor or metal particles are dispersed in a insulating material.

6. The memory device according to claim 1, wherein the charge retention layer includes a floating electrode.

7. The memory device according to claim 1, wherein the charge retention layer includes a stacked structure in which a plurality of floating electrode layers are stacked, spaced by a insulating layer.

8. The memory device according to claim 1, wherein the charge retention layer includes a plurality of insulating layers having different energy barriers.

9. The memory device according to claim 1, wherein the charge retention layer includes two insulating layers, and an intermediate insulating layer provided between the two insulating layers and having a lower energy barrier than the two insulating layers.

10. The memory device according to claim 1, wherein the charge retention layer includes two insulating layers, and an intermediate insulating layer provided between the two insulating layers and having a higher energy barrier than the two insulating layers.

11. The memory device according to claim 1, wherein the semiconductor substrate includes SOI (silicon on insulator).

12. The memory device according to claim 1, wherein, when the potential of the semiconductor substrate is higher than the potential of the semiconductor layer, a hole current injected from the semiconductor substrate and passing through the first insulating film is larger than an electron current injected from the semiconductor layer and passing through the second insulating film.

13. The memory device according to claim 1, wherein, when the potential of the semiconductor layer is higher than the potential of the semiconductor substrate, a hole current injected from the semiconductor layer and passing through the second insulating film is larger than an electron current injected from the semiconductor substrate and passing through the first insulating film.

14. The memory device according to claim 1, further comprising a peripheral circuit, the peripheral circuit including:
 a voltage generation circuit configured to generate voltages to be applied to the semiconductor substrate and the semiconductor layer;
 a voltage control circuit configured to apply the voltages to the semiconductor substrate and the semiconductor layer;
 a first read circuit configured to read a threshold of a transistor including the first channel upon application of the voltage to the semiconductor layer; and
 a second read circuit configured to read a threshold of a transistor including the second channel upon application of the voltage to the semiconductor substrate.

15. The memory device according to claim 14, wherein the peripheral circuit detects a position of charge in the direction perpendicular to the layer plane of the charge retention layer.

16. A method for driving a nonvolatile semiconductor memory device, the nonvolatile semiconductor memory device including a semiconductor substrate including a first channel, and a source region and a drain region provided on both sides of the first channel; a first insulating film provided on and in direct contact with the first channel; a charge retention layer provided on the first insulating film; a second insulating film provided on the charge retention layer; and a semiconductor layer including a second channel provided on and in direct contact with the second insulating film, and a source region and a drain region provided on both sides of the second channel, the method comprising:
 reading a threshold of a transistor including the first channel;
 reading a threshold of a transistor including the second channel; and
 outputting information corresponding to a storage state of charge retained in the charge retention layer.

17. The method according to claim 16, wherein the storage state of charge retained in the charge retention layer is changed by applying a voltage between the semiconductor substrate and the semiconductor layer to inject electrons from the semiconductor substrate into the charge retention layer, the voltage being such that the semiconductor layer has a higher potential than the semiconductor substrate.

18. The method according to claim 16, wherein the storage state of charge retained in the charge retention layer is changed by applying a voltage between the semiconductor substrate and the semiconductor layer to inject electrons from the semiconductor layer into the charge retention layer, the voltage being such that the semiconductor substrate has a higher potential than the semiconductor layer.

19. The method according to claim 16, wherein the storage state of charge retained in the charge retention layer is changed by applying a voltage between the semiconductor substrate and the semiconductor layer to inject holes from the semiconductor layer into the charge retention layer, the voltage being such that the semiconductor layer has a higher potential than the semiconductor substrate.

20. The method according to claim 16, wherein the storage state of charge retained in the charge retention layer is changed by applying a voltage between the semiconductor substrate and the semiconductor layer to inject holes from the semiconductor substrate into the charge retention layer, the voltage being such that the semiconductor substrate has a higher potential than the semiconductor layer.

* * * * *